(12) United States Patent
Kondo

(10) Patent No.: US 10,797,069 B2
(45) Date of Patent: Oct. 6, 2020

(54) SEMICONDUCTOR MEMORY DEVICE

(71) Applicant: TOSHIBA MEMORY CORPORATION, Minato-ku, Tokyo (JP)

(72) Inventor: Masaki Kondo, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/118,356

(22) Filed: Aug. 30, 2018

(65) Prior Publication Data

US 2019/0287993 A1    Sep. 19, 2019

(30) Foreign Application Priority Data

Mar. 19, 2018  (JP) .................................. 2018-050515

(51) Int. Cl.
| | | |
|---|---|---|
| *G11C 16/04* | (2006.01) | |
| *H01L 27/11582* | (2017.01) | |
| *H01L 27/11565* | (2017.01) | |
| *H01L 27/1157* | (2017.01) | |
| *H01L 21/768* | (2006.01) | |
| *G11C 16/10* | (2006.01) | |

(Continued)

(52) U.S. Cl.
CPC ........ *H01L 27/11582* (2013.01); *G11C 16/10* (2013.01); *H01L 21/76805* (2013.01); *H01L 21/76831* (2013.01); *H01L 21/76832* (2013.01); *H01L 27/1157* (2013.01); *H01L 27/11565* (2013.01); *G11C 16/0483* (2013.01);

*H01L 29/40117* (2019.08); *H01L 29/513* (2013.01); *H01L 29/517* (2013.01); *H01L 29/518* (2013.01)

(58) Field of Classification Search
CPC .. G11C 16/0483; G11C 16/10; G11C 16/0466
See application file for complete search history.

(56) References Cited

U.S. PATENT DOCUMENTS

| | | | |
|---|---|---|---|
| 2008/0002475 A1* | 1/2008 | Yang ...................... | H01L 27/115 365/185.26 |
| 2010/0096680 A1* | 4/2010 | Mouli ..................... | B82Y 10/00 257/296 |

(Continued)

FOREIGN PATENT DOCUMENTS

JP            2017-10951 A       1/2017

*Primary Examiner* — Jay W. Radke
(74) *Attorney, Agent, or Firm* — Foley & Lardner LLP

(57) ABSTRACT

A semiconductor memory device includes a semiconductor substrate, a pillar disposed above the semiconductor substrate and extending in a first direction crossing a principal surface of the semiconductor substrate, a plurality of first memory cells arranged on a first side surface of the pillar along the first direction, and a plurality of second memory cells arranged on a second side surface of the pillar along the first direction. The memory device further includes a plurality of first control gate layers respectively connected to the first memory cells, a plurality of second control gate layers respectively connected to the second memory cells, and a stacked film disposed between one of the first control gate layers and one of the second control gate layers, the stacked film including a first insulating layer, a second insulating layer, and an electron capture layer disposed between the first insulating layer and the second insulating layer.

7 Claims, 17 Drawing Sheets

(51) Int. Cl.
*H01L 29/51* (2006.01)
*H01L 21/28* (2006.01)

(56) References Cited

U.S. PATENT DOCUMENTS

| | | | | |
|---|---|---|---|---|
| 2011/0286283 A1* | 11/2011 | Lung | ............ | G11C 16/0483 |
| | | | | 365/185.28 |
| 2015/0200199 A1 | 7/2015 | Sakamoto et al. | | |
| 2016/0260725 A1* | 9/2016 | Jung | ............ | H01L 27/11565 |
| 2017/0338243 A1* | 11/2017 | Sohn | ............ | H01L 27/11524 |

* cited by examiner

FIG. 5
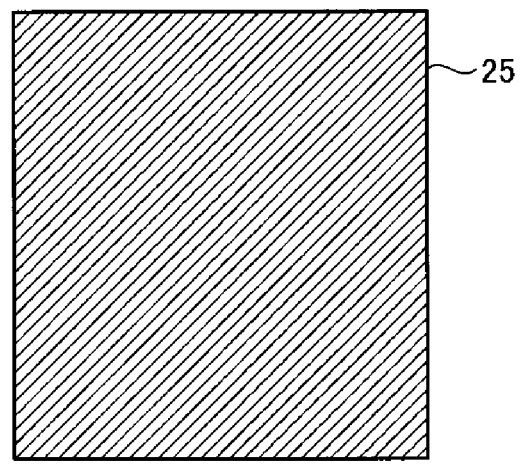
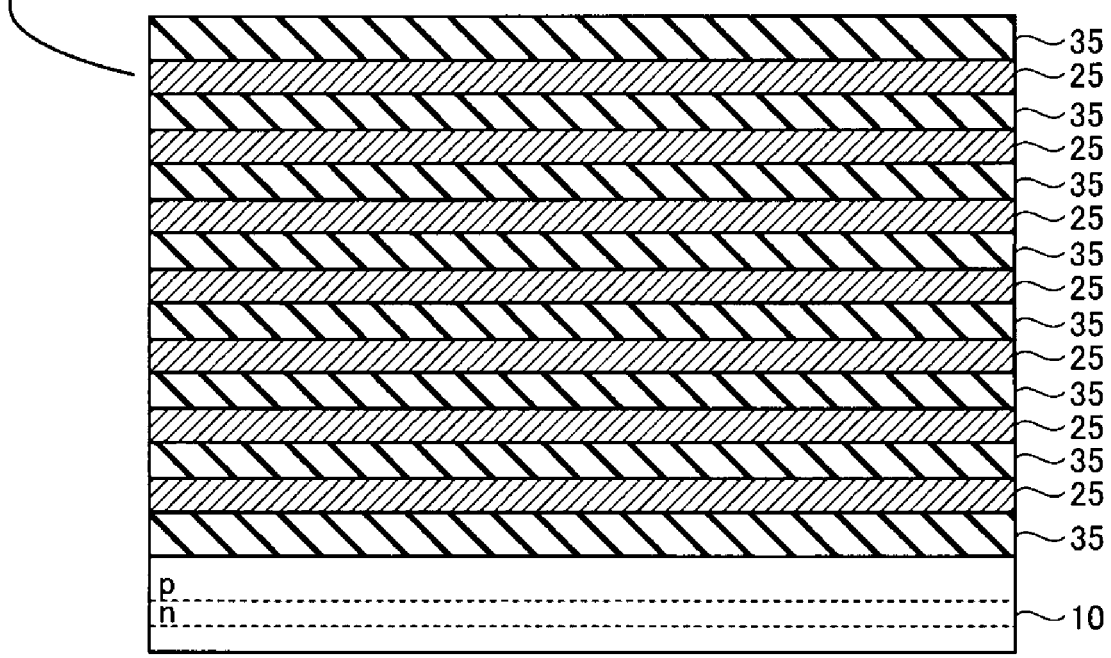

FIG. 13
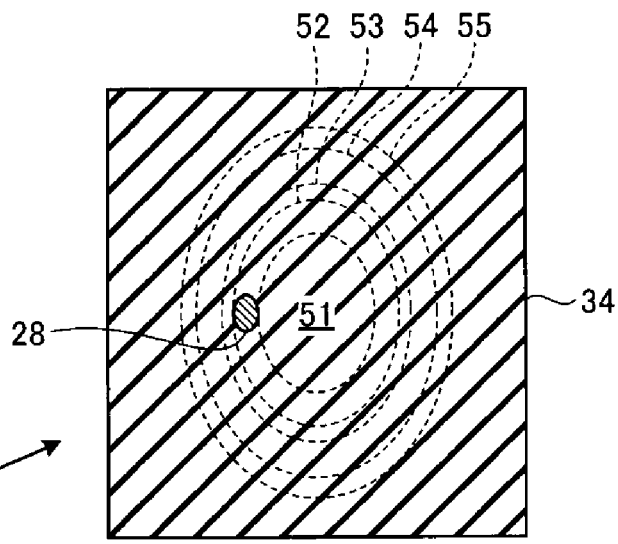
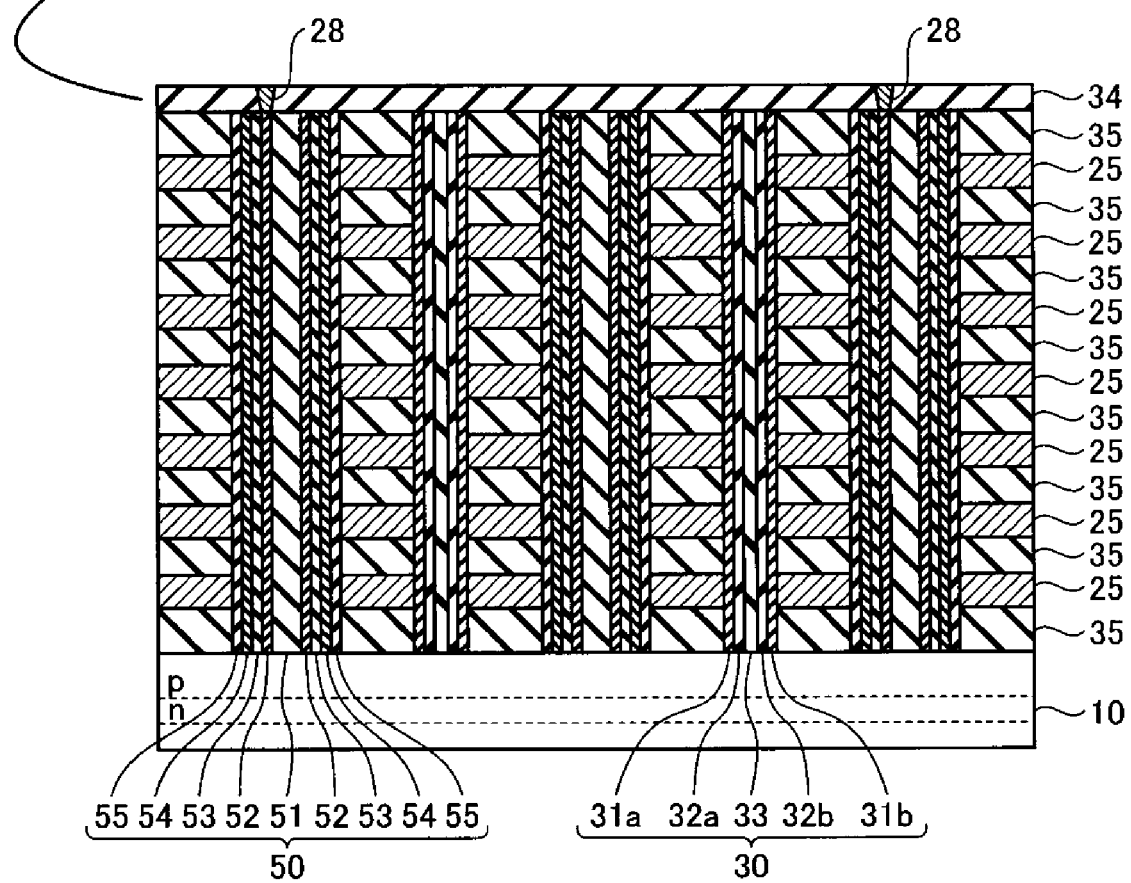

FIG. 14
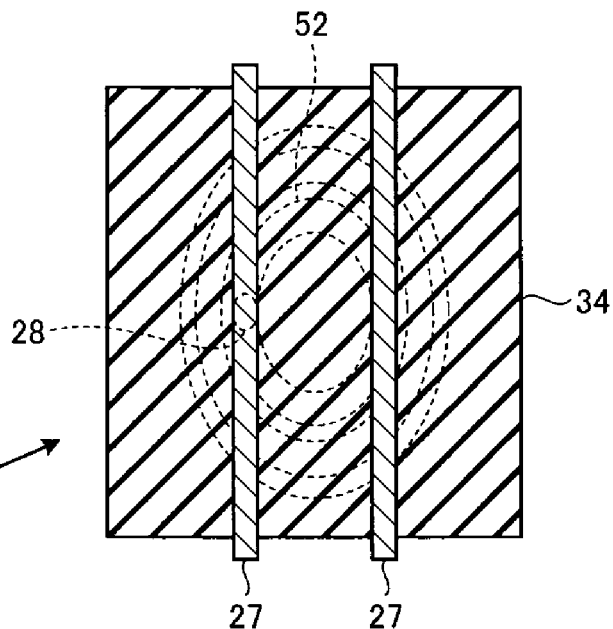
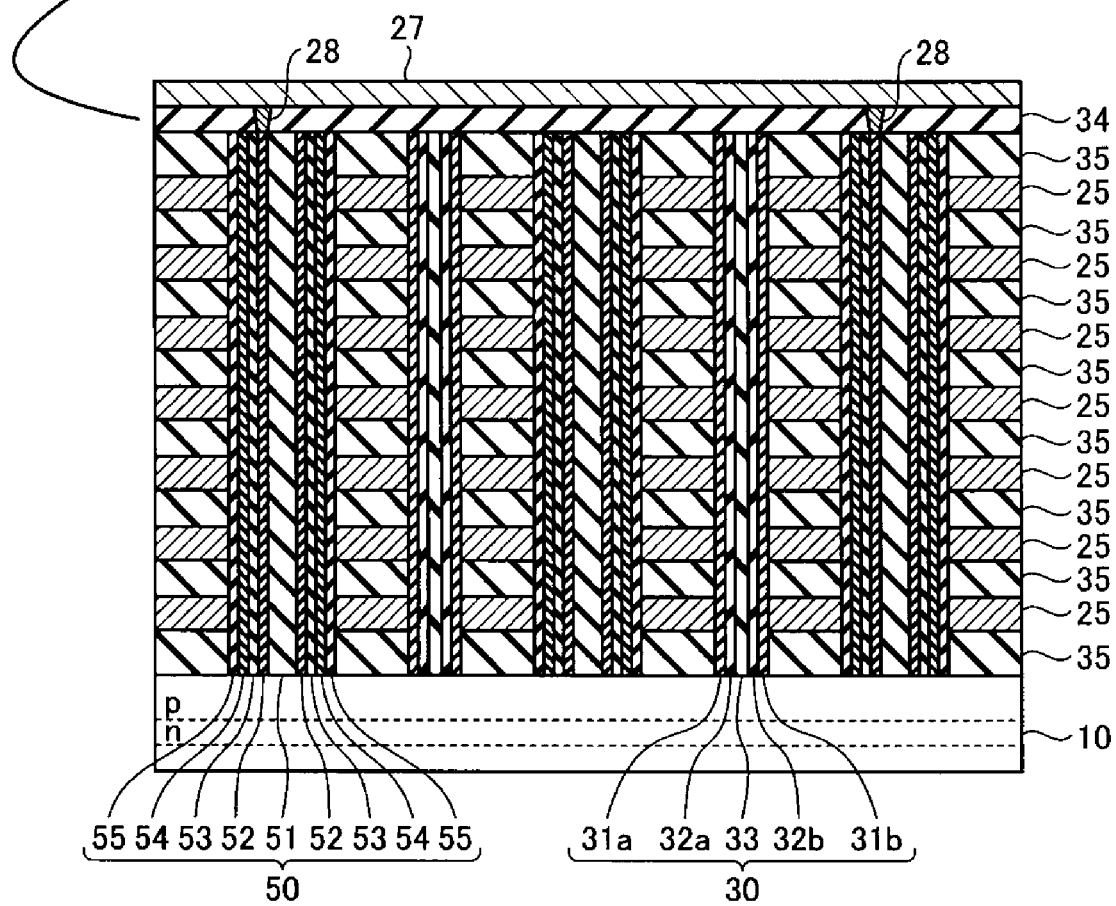

SEMICONDUCTOR MEMORY DEVICE

CROSS-REFERENCE TO RELATED APPLICATIONS

This application is based on and claims the benefit of Japanese Patent Application No. 2018-050515, filed Mar. 19, 2018, the entire contents of which are incorporated herein by reference.

FIELD

Embodiments described herein relate generally to a semiconductor memory device.

BACKGROUND

With the development of miniaturization of semiconductor memory devices, a three-dimensional nonvolatile memory including memory cells of stacked structures has been proposed. In the three-dimensional nonvolatile memory, structures in which a plurality of memory cells are stacked in a height direction on side surfaces of pillar channel semiconductor films extending in the height direction are arranged two-dimensionally on a semiconductor layer. It would be beneficial, in at least some implementations, to mitigate the influence of parasitic cells that could be generated in unintended sites in the semiconductor memory device having such structures.

DESCRIPTION OF THE DRAWINGS

FIG. 5 is a flowchart illustrating an example of procedures for a manufacturing process of the semiconductor memory device according to the embodiment.

FIG. 13 is a flowchart illustrating an example of procedures for the manufacturing process of the semiconductor memory device according to the embodiment.

FIG. 14 is a flowchart illustrating an example of procedures for the manufacturing process of the semiconductor memory device according to the embodiment.

DETAILED DESCRIPTION

Embodiments described herein provide for a semiconductor memory device that can mitigate the influence of, or help to prevent the formation of, a parasitic cell in a semiconductor memory device having a three-dimensional structure.

In general, according to one embodiment, a semiconductor memory device includes a semiconductor substrate, a pillar disposed above the semiconductor substrate and extending in a first direction crossing a principal surface of the semiconductor substrate, a plurality of first memory cells arranged on a first side surface of the pillar along the first direction, and a plurality of second memory cells arranged on a second side surface of the pillar along the first direction. The semiconductor memory device further includes a plurality of first control gate layers disposed along the first direction and respectively connected to the first memory cells, a plurality of second control gate layers disposed along the first direction and respectively connected to the second memory cells, and a stacked film disposed between one of the first control gate layers and one of the second control gate layers, the stacked film including a first insulating layer, a second insulating layer, and an electron capture layer disposed between the first insulating layer and the second insulating layer, the electron capture layer configured to capture electrons.

Embodiments will be described hereinafter in detail with reference to the drawings. It is noted that the present disclosure is not limited to the embodiments explicitly described herein. Moreover, constituent elements of the embodiments described herein include those that could be readily conceived of by a person skilled in the art or those that are substantially identical to the constituent elements explicitly described herein.

A semiconductor memory device according to an embodiment will be described with reference to FIGS. 1 to 14.

[Example of Configuration of a Semiconductor Memory Device According to an Embodiment]

Figure 1:
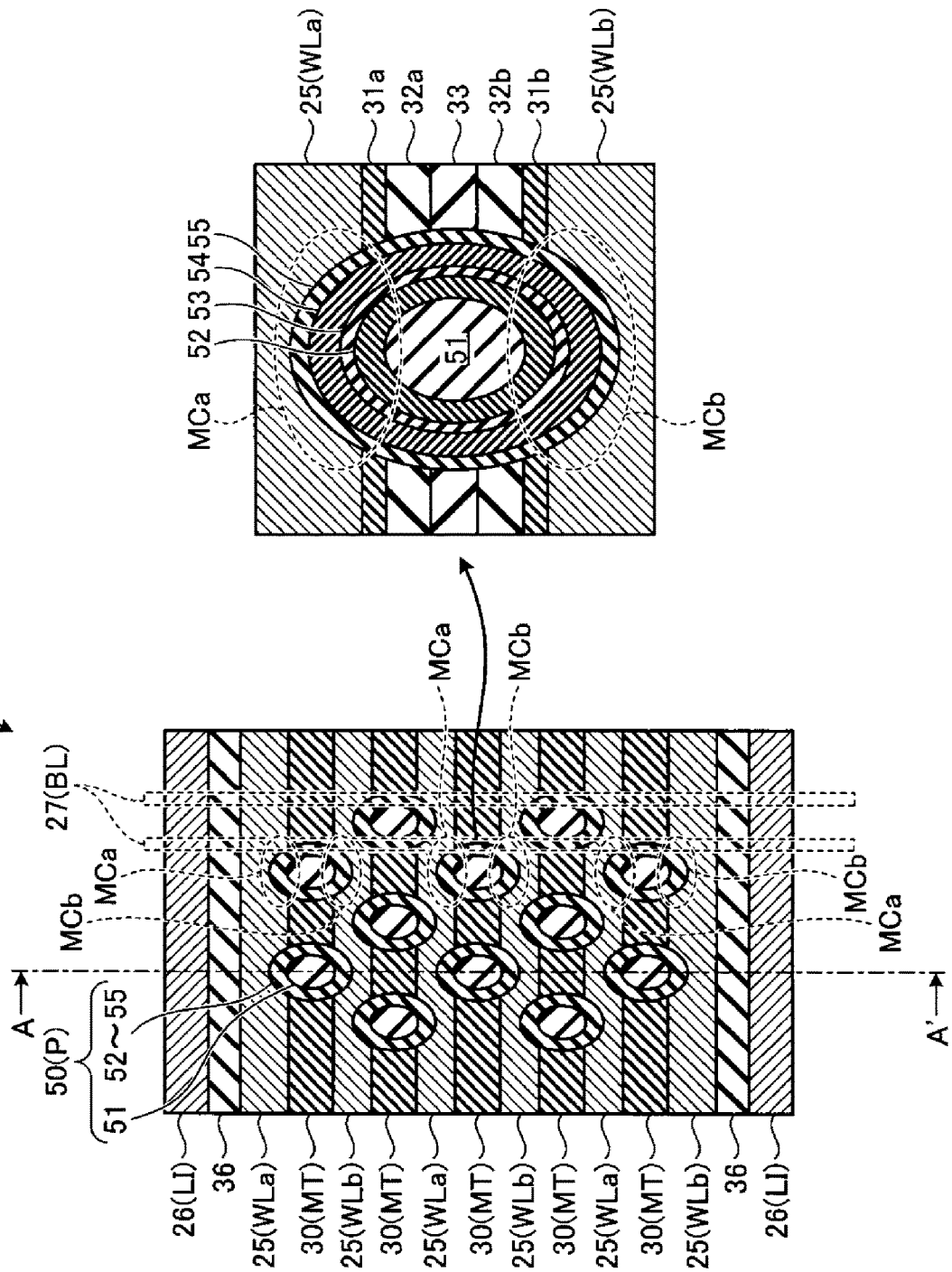
FIG. 1 is a plan view of a semiconductor memory device and an enlarged view of the semiconductor memory device near a pillar according to an embodiment.
Figure 2:
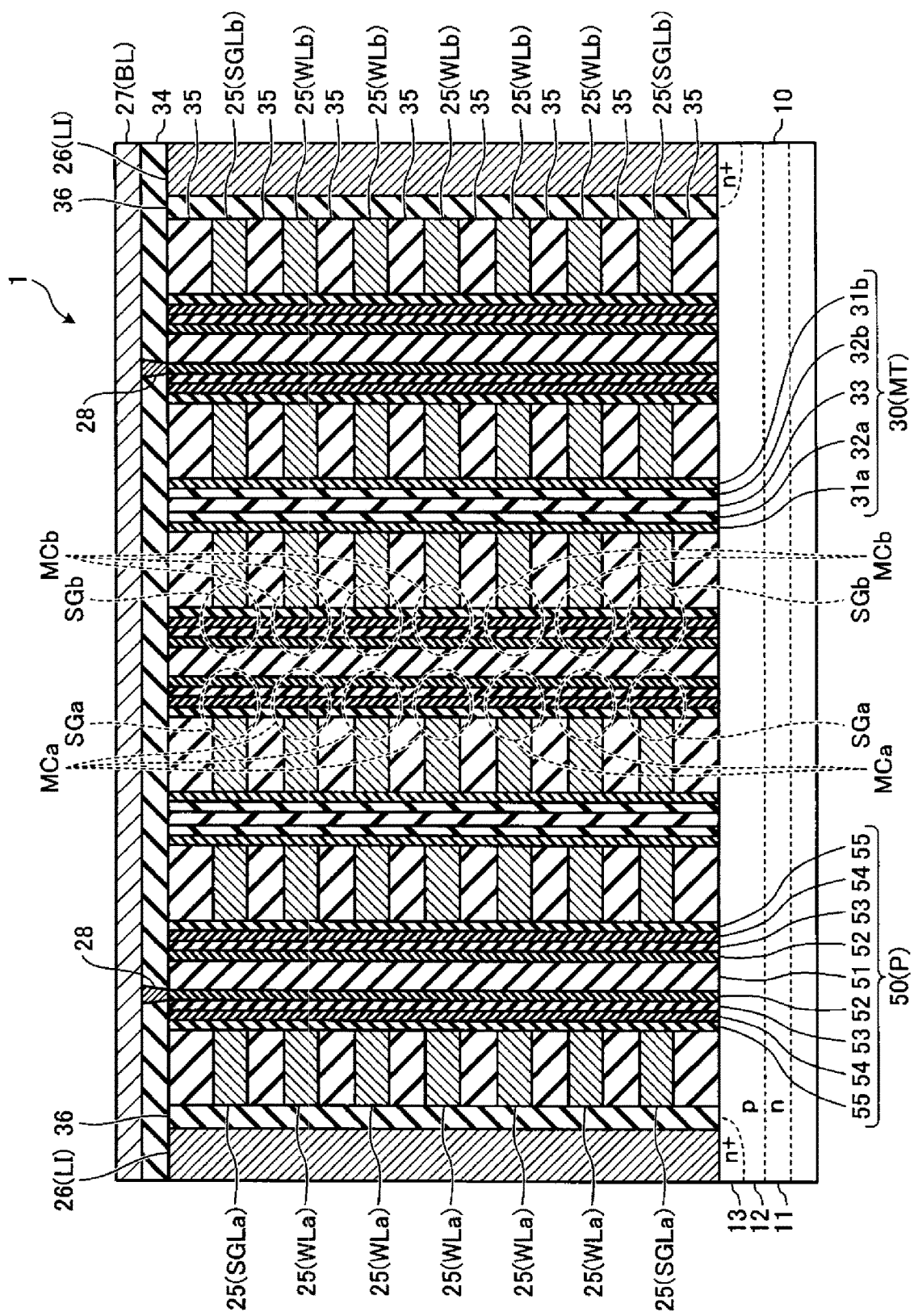
FIG. 2 is a cross-sectional view taken along a line A-A' of FIG. 1.

FIG. 1 is a plan view of a semiconductor memory device and an enlarged view of the semiconductor memory device near a pillar P according to the embodiment. It is noted, however, that upper insulating layers 34 and 35 are omitted and only two bit lines BL are shown for illustrating a configuration near word lines WLa and WLb. FIG. 2 is a cross-sectional view taken along a line A-A' of FIG. 1.

A semiconductor memory device 1 in the embodiment is configured as, for example, a NAND-type flash memory.

The semiconductor memory device 1 includes, on a semiconductor substrate 10, pillar structures 50, a plurality of conductor layers 25 as control gate layers, and stacked films 30 dividing the conductor layers 25.

As shown in FIGS. 1 and 2, the semiconductor memory device 1 is formed on the semiconductor substrate 10, such as a silicon substrate. The semiconductor substrate 10 has an n-well 11 in a surface layer portion, has a p-well 12 within the n-well 11, and has a plurality of $n^+$ wells 13 within the p-well 12.

The pillar structures 50 are each formed into, for example, an elliptical shape from a top view. The pillar structures 50 include a plurality of core sections 51 extending substantially perpendicularly on the p-well 12 with the plurality of core sections 51 sandwiched or disposed between the two n+ wells 13 of the semiconductor substrate 10 in a horizontal direction parallel to a top surface of the substrate 10 (e.g. a surface on which the pillar structures 50 are disposed). A plurality of layers are formed on a side wall of each core section 51 in such a manner as to enclose the side wall thereof. These layers are, in order from a side near the core section 51, a channel layer 52, a tunnel insulating layer 53, a charge storage layer 54, and a block insulating layer 55. The core section 51 includes, for example, $SiO_2$ as a main component. The channel layer 52 is, for example, a polysilicon layer, the charge storage layer 54 is, for example, an SiN layer, and the tunnel insulating layer 53 and the block insulating layer 55 are, for example, $SiO_2$ layers.

The plurality of conductor layers 25 are disposed above the semiconductor substrate 10 around the pillar structures 50 to be separated from one another and disposed at predetermined intervals. The conductor layers 25 function as word lines WLa and WLb as will be described later. Insulating layers 35 lie between the conductor layers 25. The conductor layers 25 are, for example, tungsten (W) layers, and the insulating layers 35 are, for example, $SiO_2$ layers. In this way, the semiconductor memory device 1 has a structure in which the plurality of conductor layers 25 and the plurality of insulating layers 35 are alternately stacked. The pillar structures 50 penetrate the stacked structure from above the semiconductor substrate 10 toward the semiconductor substrate 10.

Two stacked films 30 extend in at least two directions from a side surface of each pillar structure 50. Each conductor layer 25 is thereby divided in an axial direction of the pillar structures 50. The stacked films 30 each include, from a side of one divided conductor layer 25 (word line WLa) to a side of the other conductor layer 25 (word line WLb), an insulating layer 31a, an electron capture layer 32a, an insulating layer 33, an electron capture layer 32b, and an insulating layer 31b (e.g. in that order). The electron capture layers 32a and 32b are, for example, SiN layers, the insulating layers 31a and 31b are, for example, Low-K (low dielectric constant) layers such as SiON layers and SiOC layers, and the insulating layer 33 is, for example, an $SiO_2$ layer.

The semiconductor memory device 1 further include conductor layers 26 outside of the stacked structure of the conductor layers 25 and the insulating layers 35 on the $n^+$ wells 13 of the semiconductor substrate 10. The conductor layers 26 are disposed to sandwich the stacked structure of the conductor layers 25 and the insulating layers 35 from both sides with principal surfaces thereof facing the stacked structure of the conductor layers 25 and the insulating layers 35. An insulating layer 36 lies between each of the conductor layers 26 and the stacked structure of the conductor layers 25 and the insulating layers 35.

Furthermore, the semiconductor memory device 1 includes conductor layers 27 extending above the stacked structure of the conductor layers 25 and the insulating layers 35 in a generally horizontal direction parallel to a principal surface of the semiconductor substrate 10. An insulating layer 34 lies between the conductor layers 27 and the stacked structure of the conductor layers 25 and the insulating layers 35. The channel layer 52 provided in each pillar structure 50 is connected to each conductor layer 27 by a contact 28 that penetrates the insulating layer 34. Out of the plurality of conductor layers 27, a predetermined conductor layer 27 is connected to the channel layers 52 of predetermined pillar structures 50.

[Functions of the Semiconductor Memory Device]

Functions of the semiconductor memory device 1 as the NAND-type flash memory will next be described still with reference to FIGS. 1 and 2.

The semiconductor memory device 1 includes, on the semiconductor substrate 10, pillars P extending in a direction crossing the principal surface of the semiconductor substrate 10, memory cells MCa arranged on side surfaces of pillars P on one side along a height direction of the pillars P and serving as a plurality of first memory cells, and memory cells MCb arranged on the side surfaces of the pillars P on the other side (e.g. across from, or opposite to the one side) along the height direction of the pillars P and serving as a plurality of second memory cells.

Moreover, the semiconductor memory device 1 includes word lines WLa disposed along the height direction of the pillars P and serving as first control gate layers each connected to the memory cells MCa, and word lines WLb disposed along the height direction of the pillars P and serving as second control gate layers each connected to the memory cells MCb.

The pillar structures 50 each function as the pillar P with the memory cells MCa arranged on the side surface thereof on one side and the memory cells MCb arranged on the side surface thereof on the other side (e.g. across from, or opposite to the one side). These pillars P extend in a direction crossing the principal surface of the semiconductor substrate 10 (e.g. in an approximately perpendicular direction to the principal surface).

At least portions, contiguous to the side surfaces of the pillars P on one side, and neighborhoods thereof of the conductor layers 25 divided by the stacked films 30 function as the word lines WLa connected to the memory cells MCa. Each memory cell MCa is associated with the word line WLa disposed at the same height, and includes the channel layer 52, the tunnel insulating layer 53, the charge storage layer 54, and the block insulating layer 55 on the side facing the word line WLa as constituent elements of the memory cell MCa. Each memory cell MCa is disposed along the side surface of the pillar P on the side facing the word line WLa. These memory cells MCa function as a memory string stretching on one side of one pillar P.

Among the plurality of conductor layers 25, uppermost and lowermost conductor layers 25 disposed on the same side as the word lines WLa relative to the pillars P function as select gate lines SGLa. The select gate lines SGLa are used at a time of selecting a predetermined memory string from among the memory strings (including the memory cells MCa) for the plurality of pillars P. Furthermore, the channel layer 52, the tunnel insulating layer 53, the charge storage layer 54, and the block insulating layer 55 associated with each select gate line SGLa function as a select gate SGa. Turning on or off the select gate SGa makes the predetermined memory string into a selected or unselected state.

At least portions, continuous to the side surfaces of the pillars P on the other side, and neighborhoods thereof of the conductor layers 25 divided by the stacked films 30 function as the word lines WLb connected to the memory cells MCb. Each memory cell MCb is associated with the word line WLb disposed at the same height, and includes the channel layer 52, the tunnel insulating layer 53, the charge storage layer 54, and the block insulating layer 55 on the side facing the word line WLb as constituent elements of the memory cell MCb. Each memory cell MCb is disposed along the side surface of the pillar P on the side facing the word line WLb. These memory cells MCa function as a memory string stretching on the other side of one pillar P.

Among the plurality of conductor layers 25, uppermost and lowermost conductor layers 25 present on the same side as the word lines WLb relative to the pillars P function as select gate lines SGLb. The select gate lines SGLb are used at a time of selecting a predetermined memory string from among the memory strings (including the memory cells MCb) for the plurality of pillars P. Furthermore, the channel layer 52, the tunnel insulating layer 53, the charge storage layer 54, and the block insulating layer 55 associated with each select gate line SGLb function as a select gate SGb. Turning on or off the select gate SGb sets the predetermined memory string to a selected or unselected state.

The conductor layers 26 outside of these memory cells MCa and MCb arranged in a matrix configuration function as plate-like source line contacts LI. Furthermore, the conductor layers 27 disposed above the memory cells MCa and MCb function as bit lines BL.

The semiconductor memory device 1 further includes the stacked films 30 each including the insulating layer 31a dividing the word lines WLa and WLb in the axial direction of the pillars P and serving as a first insulating layer, the insulating layer 31b dividing the word lines WLa and WLb in the axial direction of the pillars P and serving as a second insulating layer, and the electron capture layers 32a and 32b disposed between the insulating layers 31a and 31b and capable of capturing electrons.

The stacked films 30 each function as a dividing film MT dividing the word lines WLa and WLb. Furthermore, the electron capture layers 32a and 32b in the stacked films 30 can capture electrons. When data is written to the memory cell MCa at least at a predetermined level (height), electrons are captured into the electron capture layer 32a at the same level (height). When data is written to the memory cell MCb at least at a predetermined level (height), electrons are captured into the electron capture layer 32b at the same level (height).

[Operation of Semiconductor Memory Device]

Figure 3:
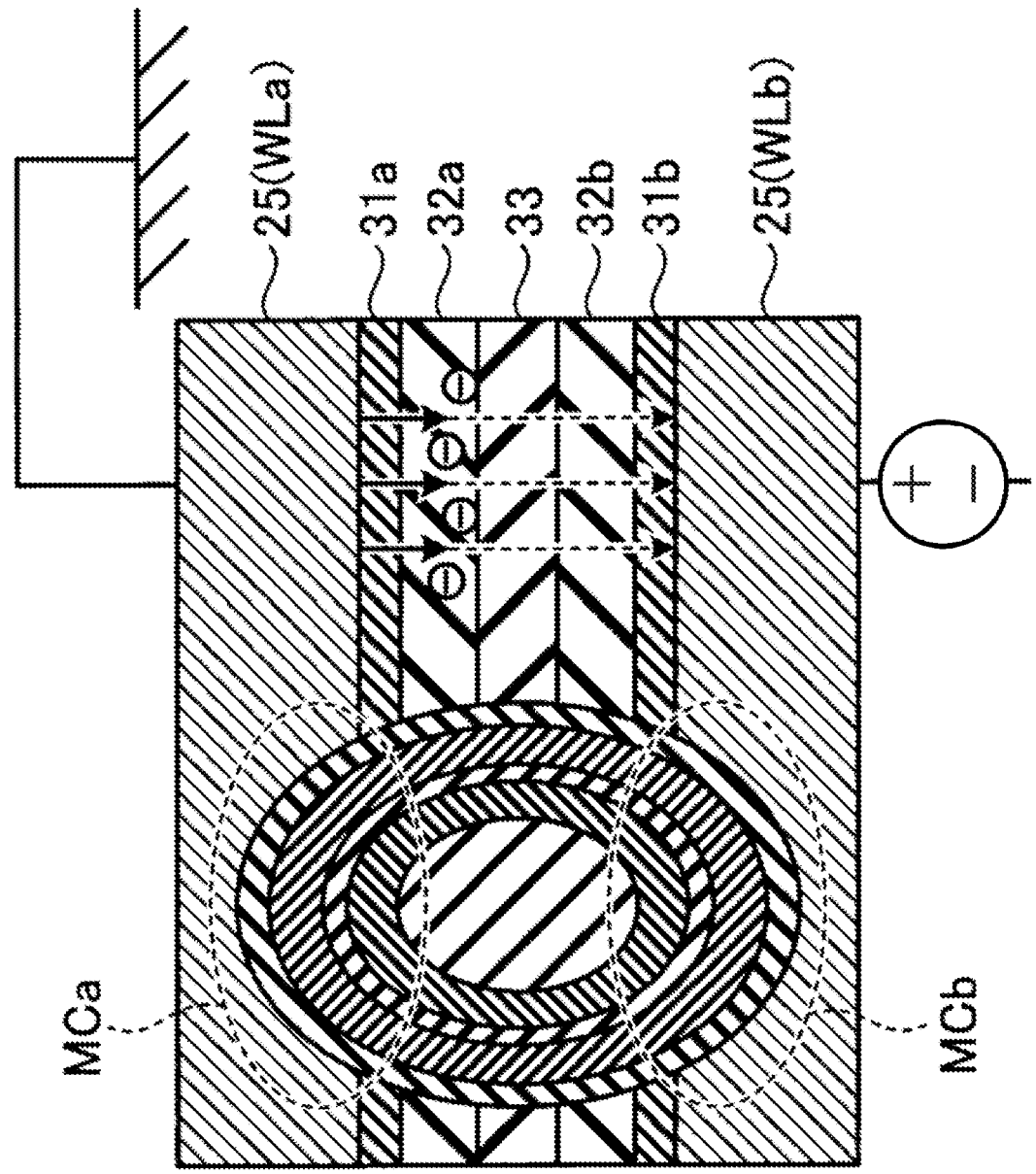
FIG. 3 is a schematic diagram illustrating a state of capturing electrons into one of a plurality of electron capture layers in a stacked film according to the embodiment.

An example of operation of the semiconductor memory device 1 will next be described with reference to FIGS. 3 and 4. FIG. 3 is a schematic diagram illustrating a state of capturing electrons into one electron capture layer 32a in the stacked film 30 according to the embodiment.

As shown in FIG. 3, when data is written to the memory cell MCa at the predetermined level, the word line WLa connected to this memory cell MCa, that is, the word line WLa at the same level as that of this memory cell MCa is grounded. In addition, a high voltage (e.g. a voltage higher than the ground voltage) is applied to the word line WLb paired with and corresponding to the grounded word line WLa, that is, the word line WLb at the same level as that of this memory cell MCa. The insulating layer 31a thereby functions as if acting as a tunnel insulating layer, and electrons tunnel through the insulating layer 31a from the word line WLa and are injected and captured into the electron capture layer 32a. Data is written to the memory cell MCa in this way in a state of capturing electrons into the electron capture layer 32a.

When data of "1" (for example, "H" level data) is written to the memory cell MCa, a write voltage is applied to the word line WLa connected to the memory cell MCa. When a channel is formed in the channel layer 52 provided in the pillar P having the memory cell MCa and connected to a source line and a bit line BL which are not shown, electrons tunnel through the tunnel insulating layer 53 and are injected and stored into the charge storage layer 54. A threshold voltage Vth of the memory cell MCa thereby rises and the data of "1" is written to the memory cell MCa. When data of "0" (for example, "L" level data) is written to the memory cell MCa, the channel in the channel layer 52 is made into a floating state to prohibit electrons from being injected into the charge storage layer 54, thereby writing the data of "0" to the memory cell MCa.

Figure 4:
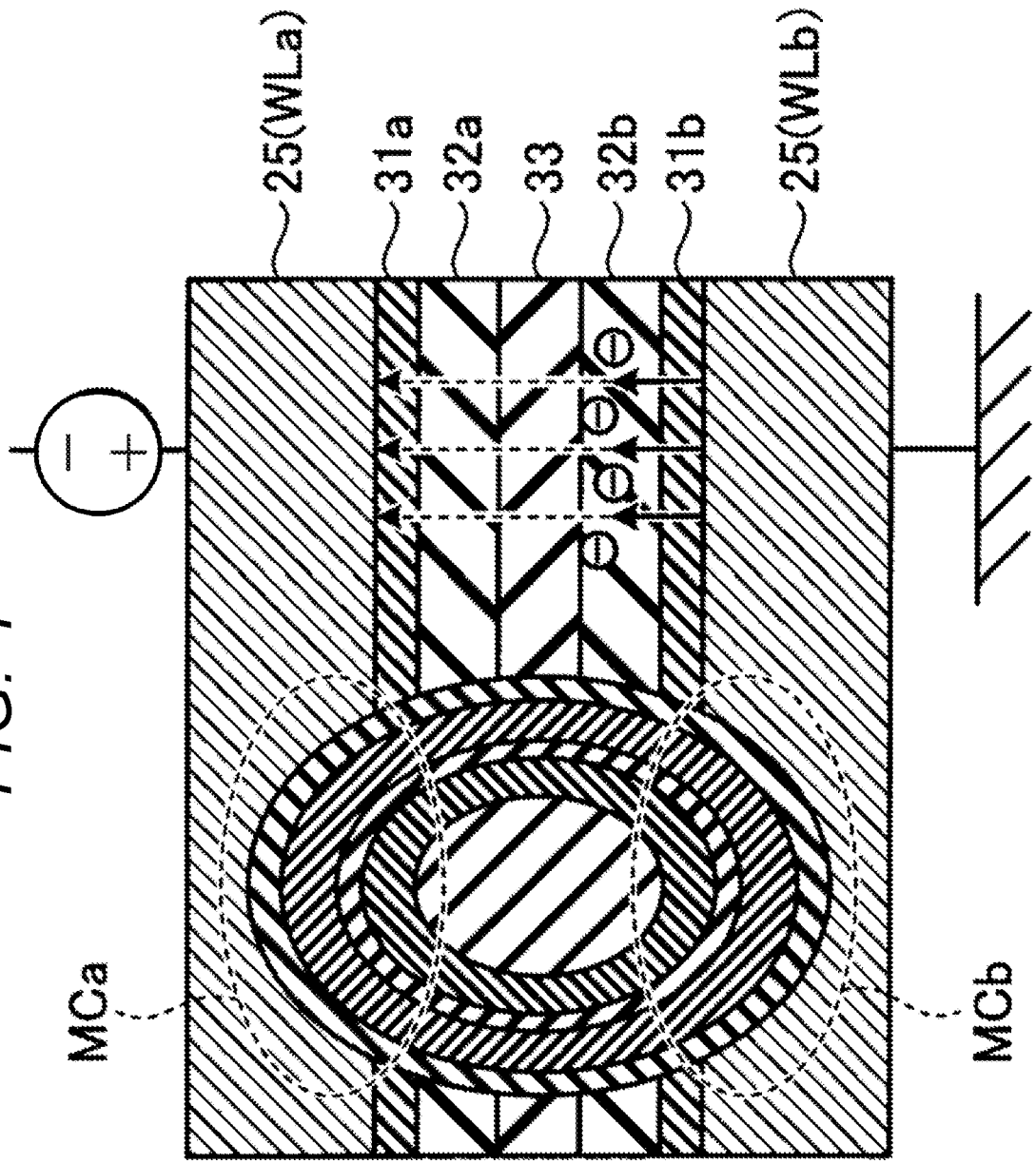
FIG. 4 is a schematic diagram illustrating a state of capturing electrons into the other electron capture layer in the stacked film according to the embodiment.

Meanwhile, FIG. 4 is a schematic diagram illustrating a state of capturing electrons into the other electron capture layer 32b in the stacked film 30 according to the embodiment.

As shown in FIG. 4, when data is written to the memory cell MCb at the predetermined level, the word line WLb connected to this memory cell MCb, that is, the word line WLb at the same level as that of this memory cell MCb is grounded. In addition, a high voltage is applied to the word line WLa paired with and corresponding to the word line WLb, that is, the word line WLa at the same level as that of this memory cell MCb. The insulating layer 31b thereby functions as if acting as a tunnel insulating layer, and electrons tunnel through the insulating layer 31b from the word line WLb and are injected and captured into the electron capture layer 32b. Data is written to the memory cell MCb in this way in a state of capturing electrons into the electron capture layer 32b. Data is written to the memory cell MCb in a similar manner as that for writing data to the memory cell MCa.

While it is described that the electron capture layers 32a and 32b are, for example, the SiN layers and the insulating layers 31a and 31b are, for example, the Low-K layers, the electron capture layers 32a and 32b and the insulating layers 31a and 31b are not limited to these examples. It suffices that the insulating layers 31a and 31b are layers lower in dielectric constant than the electron capture layers 32a and 32b (e.g. the insulating layers 31a and 31b include a main material (e.g. a material having a highest percent, by weight, of any material that is included in the insulating layers 31a and 31b) having a lower dielectric constant than a main material of the electron capture layers 32a and 32b). Using such insulating layers 31a and 31b provides for applying the high voltage to the insulating layers 31a and 31b to carry a tunnel current and accelerate injection of electrons into the electron capture layers 32a and 32b. Therefore, the electron capture layers 32a and 32b may be, for example, SiN layers, $HfO_2$ layers, $ZrO_2$ layers, or $SiO_2$ layers. As the insulating layers 31a and 31b, the layers lower in relative dielectric constant than the electron capture layers 32a and 32b can be selected from among, for example, $SiO_2$ layers, SiON layers, and SiOC layers.

[Manufacturing Process of Semiconductor Memory Device]

An example of a manufacturing process of the semiconductor memory device 1 will next be described with reference to FIGS. 5 to 14. FIGS. 5 to 14 each illustrate an example of procedures for the manufacturing process of the semiconductor memory device 1 according to the embodiment. In each drawing, an upper stage is a plan view of the stacked structure of the conductor layers 25 and the insulating layer 35 and a lower stage is a cross-sectional view. It is noted, however, that the uppermost insulating layer 35 in the stacked structure is omitted in the plan views of FIGS. 5 to 12. Furthermore, the source contacts LI and the insulating layers 36 are omitted in each drawing.

As shown in FIG. 5, the stacked structure in which the conductor layers 25 and the insulating layers 35 are alternately stacked is formed on the p-well 12 of the semiconductor substrate 10.

Figure 6:
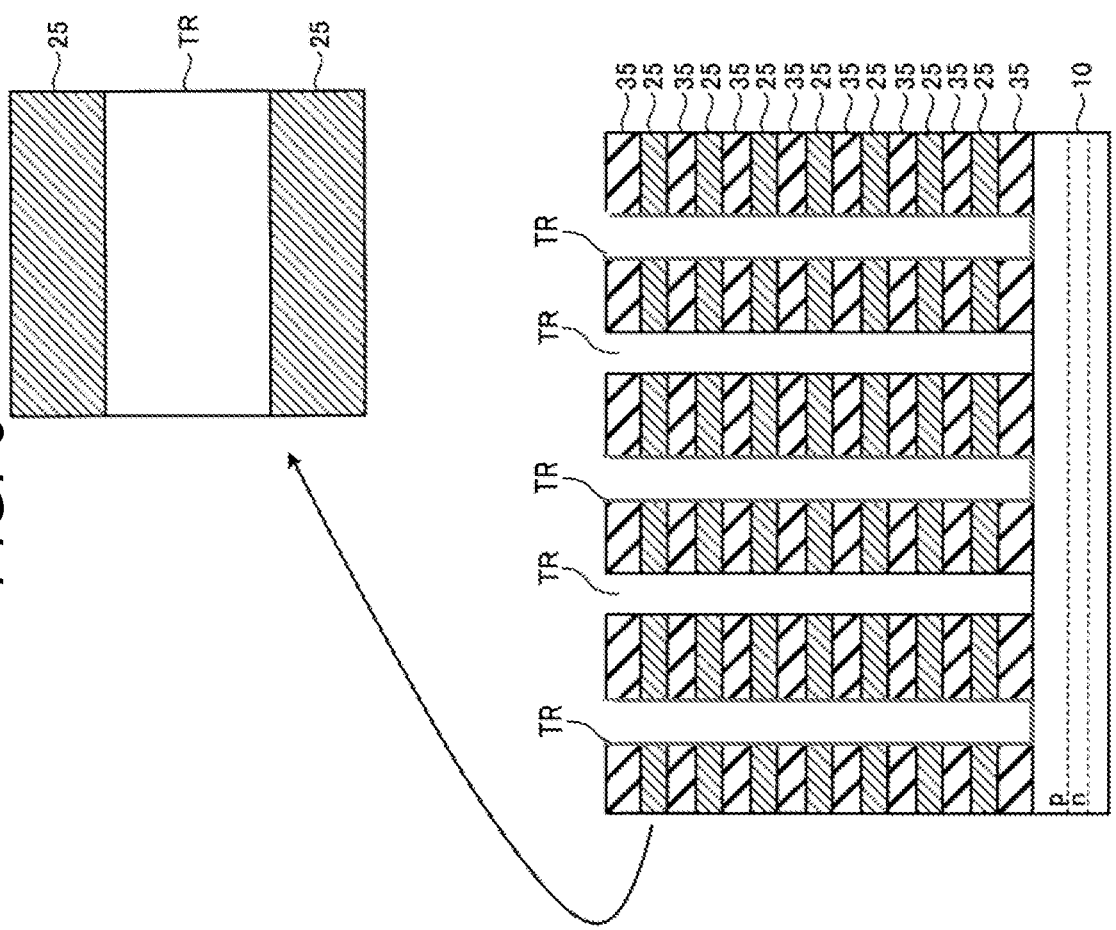
FIG. 6 is a flowchart illustrating an example of procedures for the manufacturing process of the semiconductor memory device according to the embodiment.

Next, as shown in FIG. 6, trenches TR penetrating the stacked structure of the conductor layers 25 and the insulating layers 35 are formed. These trenches TR are formed in regions where the stacked films 30 are planned to be formed.

Figure 7:
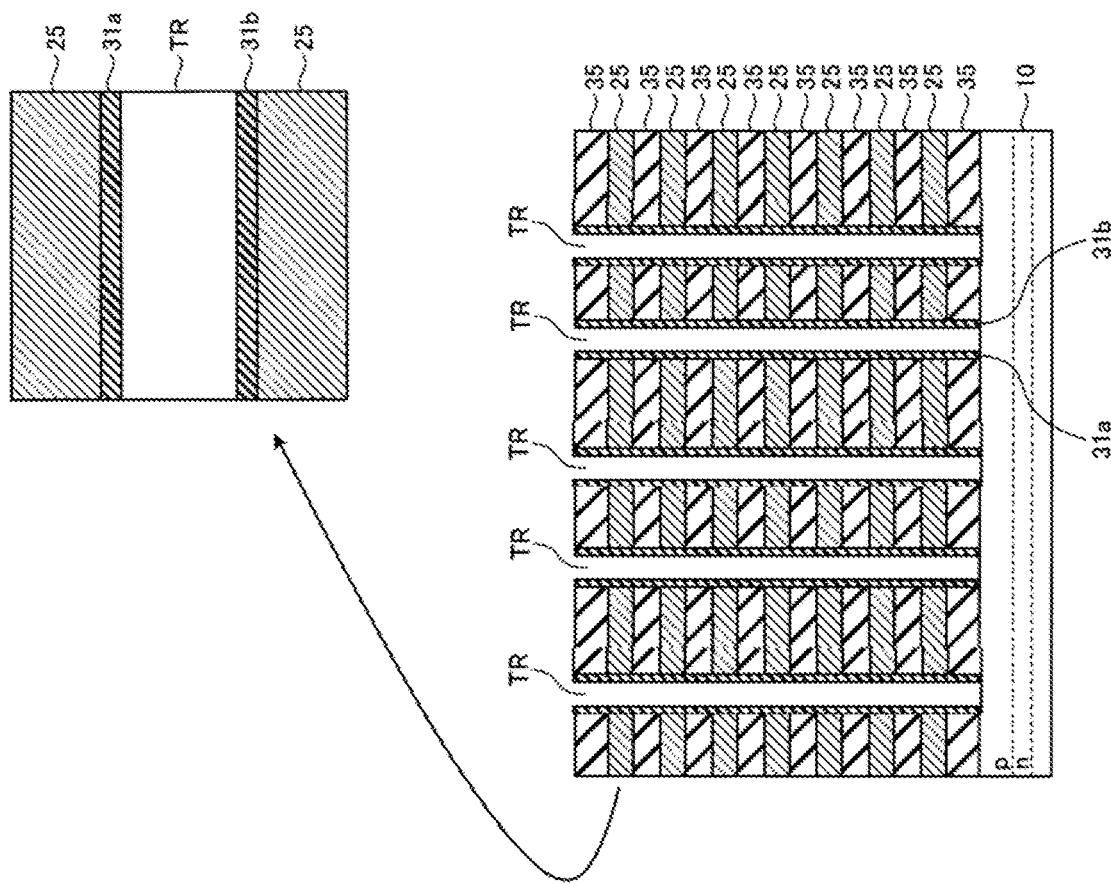
FIG. 7 is a flowchart illustrating an example of procedures for the manufacturing process of the semiconductor memory device according to the embodiment.
Figure 8:
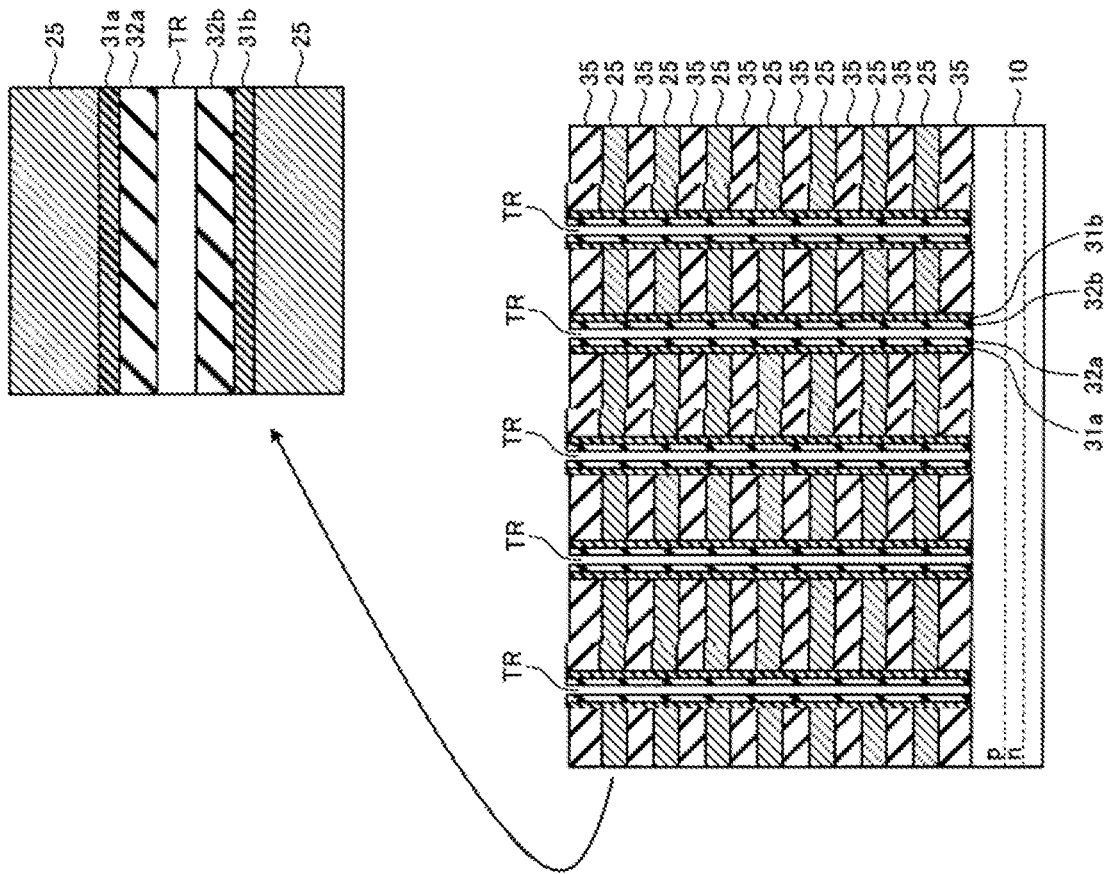
FIG. 8 is a flowchart illustrating an example of procedures for the manufacturing process of the semiconductor memory device according to the embodiment.
Figure 9:
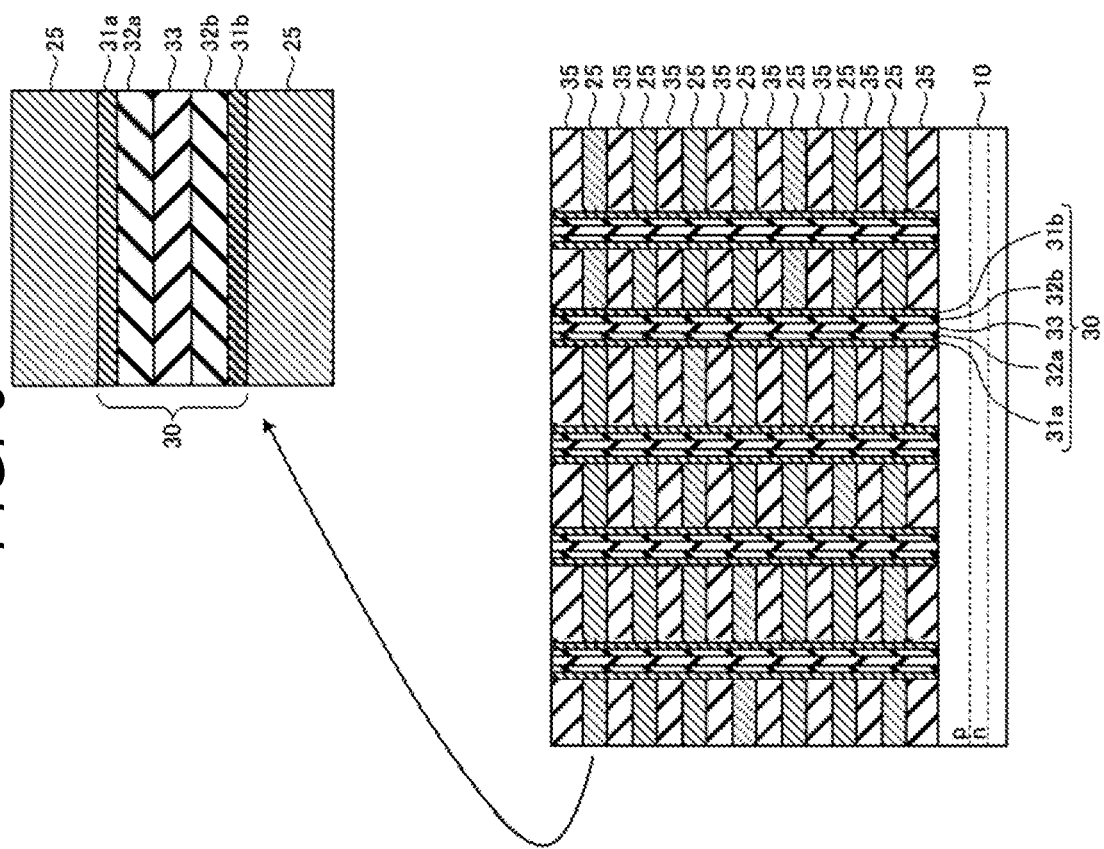
FIG. 9 is a flowchart illustrating an example of procedures for the manufacturing process of the semiconductor memory device according to the embodiment.

Next, as shown in FIG. 7, an insulating material is deposited within the trenches TR to form the insulating layers 31a and 31b on an inner wall of each trench TR. Furthermore, as shown in FIG. 8, an insulating material is deposited within the trenches TR to form the electron capture layers 32a and 32b on the insulating layers 31a and 31b, respectively. Moreover, as shown in FIG. 9, an insulating material is deposited or coated so that interiors of the trenches TR are substantially filled to form the insulating layers 33 in regions surrounded by the electron capture layers 32a and 32b. Lastly, an insulating material such as $SiO_2$ is filled into the trenches TR, thereby facilitating filling the interiors of the trenches TR while gaps within the trenches TR are eliminated as much as possible. Through these procedures, the stacked films 30 are formed.

Figure 10:
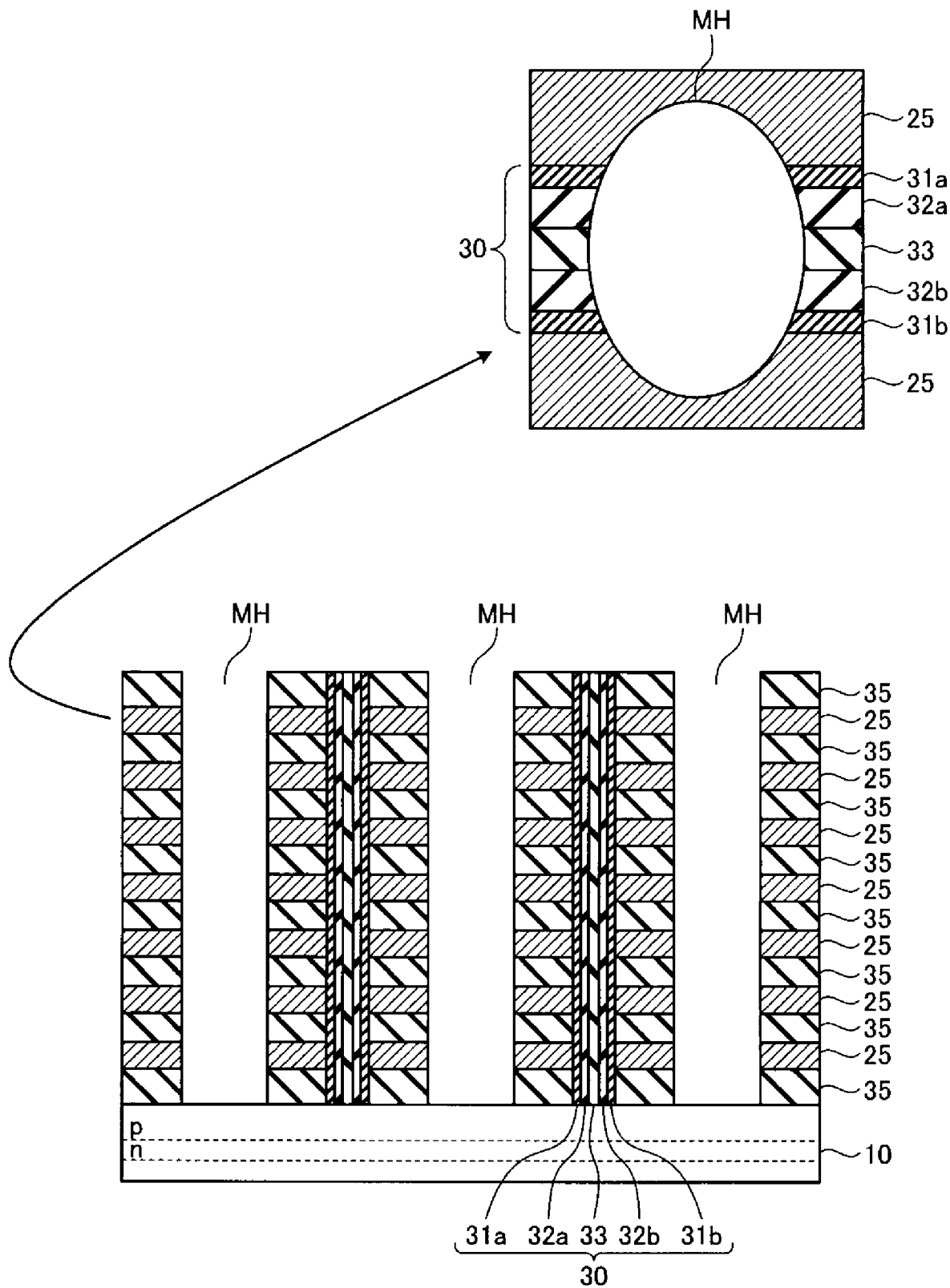
FIG. 10 is a flowchart illustrating an example of procedures for the manufacturing process of the semiconductor memory device according to the embodiment.

Next, as shown in FIG. 10, memory holes MH penetrating the stacked structure of the conductor layers 25 and the insulating layers 35 and the stacked films 30 and arriving on the semiconductor substrate 10 are formed. The memory holes MH are formed in regions where the pillar structures 50 are planned to be formed.

Figure 11:
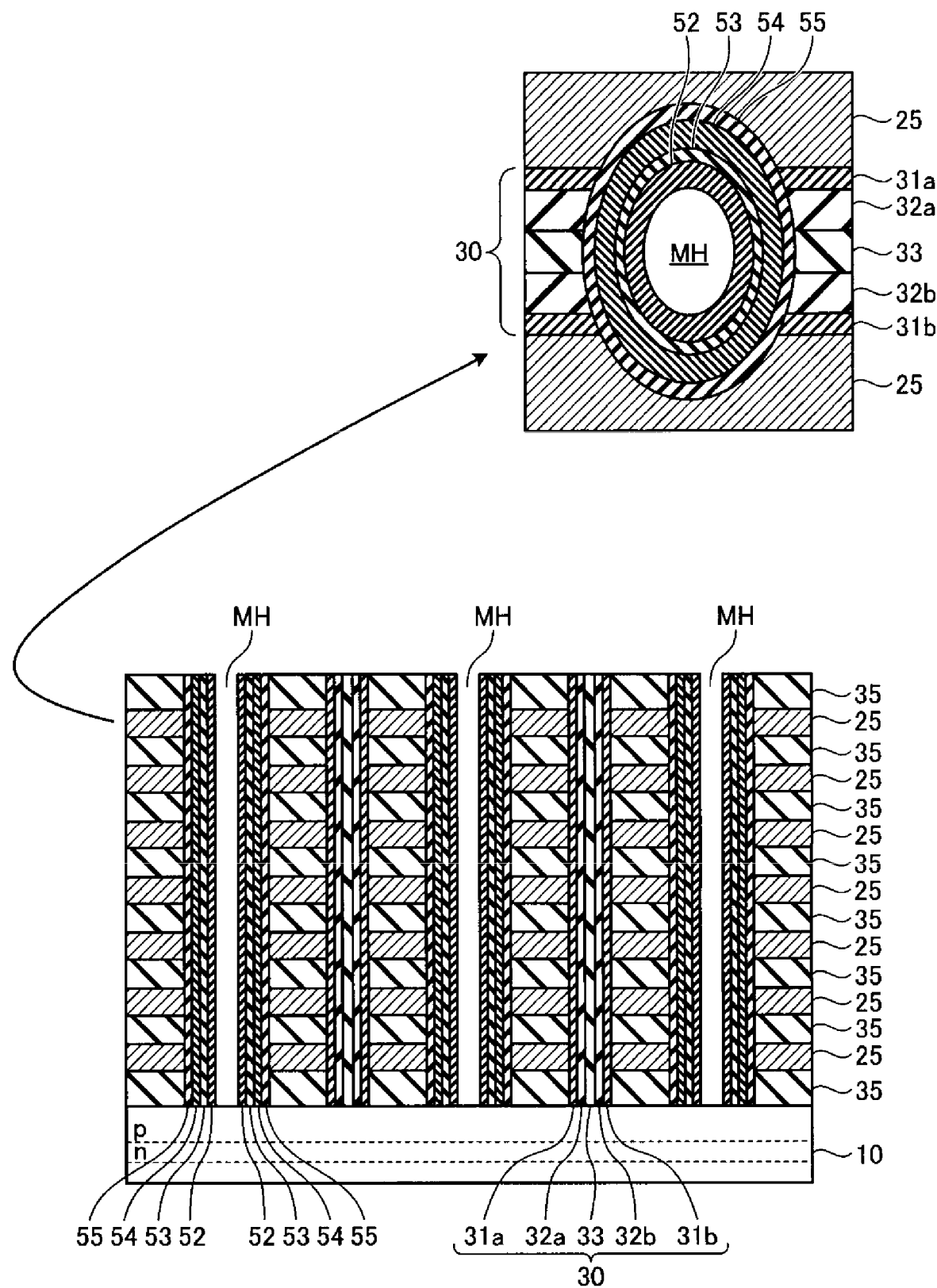
FIG. 11 is a flowchart illustrating an example of procedures for the manufacturing process of the semiconductor memory device according to the embodiment.
Figure 12:
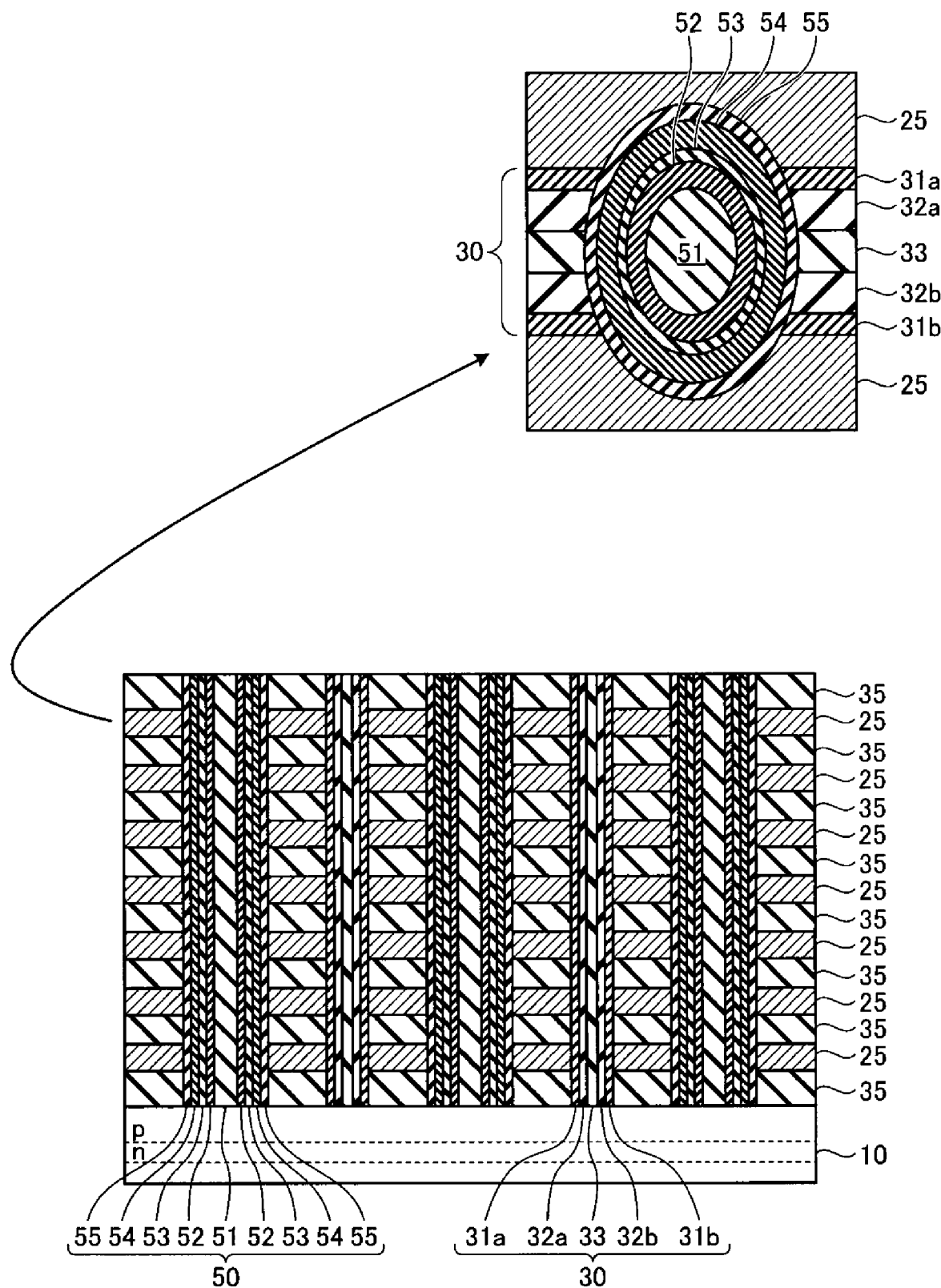
FIG. 12 is a flowchart illustrating an example of procedures for the manufacturing process of the semiconductor memory device according to the embodiment.

Next, as shown in FIG. 11, an insulating material is deposited within the memory holes MH to form the block insulating layers 55 on inner walls of the memory holes MH. In addition, an insulating material is deposited within the memory holes MH to form the charge storage layers 54 on the block insulating layers 55. In addition, an insulating material is deposited within the memory holes MH to form the tunnel insulating layers 53 on the charge storage layers 54. Further, a semiconductor material is deposited within the memory holes MH to form the channel layers 52 on the tunnel insulating layers 53. Furthermore, as shown in FIG. 12, an insulating material is deposited or coated so that interiors of the memory holes MH are substantially filled to form the core sections 51 in regions surrounded by the channel layers 52. Through these procedures the pillar structures 50 are formed.

Next, as shown in FIG. 13, the insulating layer 34 is formed on an upper surface of the stacked structure of the conductor layers 25 and the insulating layers 35. Furthermore, through-holes are formed each at a position overlapping the channel layer 52 in the predetermined pillar structure 50 in a top view, and a conductor material is filled in the through-holes. The contacts 28 are thereby formed.

Next, as shown in FIG. 14, the conductor layers 27 are formed at positions overlapping the predetermined contacts 28 on the insulating layer 34. The conductor layers 27 are thereby each connected to the channel layers 52 in the predetermined pillar structures 50 via the contacts 28.

Through these procedures, the semiconductor memory device 1 according to the embodiment is manufactured.

In or following the manufacturing process of the semiconductor memory device 1, various tests can be conducted on the semiconductor memory device 1 during die sorting after cutting down chips from the semiconductor memory device 1. It is preferable that electrons are captured into the electron capture layers 32a and 32b of the stacked films 30 using the word lines WLa and WLb at each layer during this die sorting. Basically, electric charge is fixed to the electron capture layers 32a and 32b by performing one electron capture operation and a write operation can be subsequently performed repeatedly on the memory cells MCa and MCb. Nevertheless, electrons may be captured into the electron capture layers 32a and 32b of the stacked films 30 at least before data is written to the memory cells MCa and MCb as described above.

Comparative Example

Figure 15:
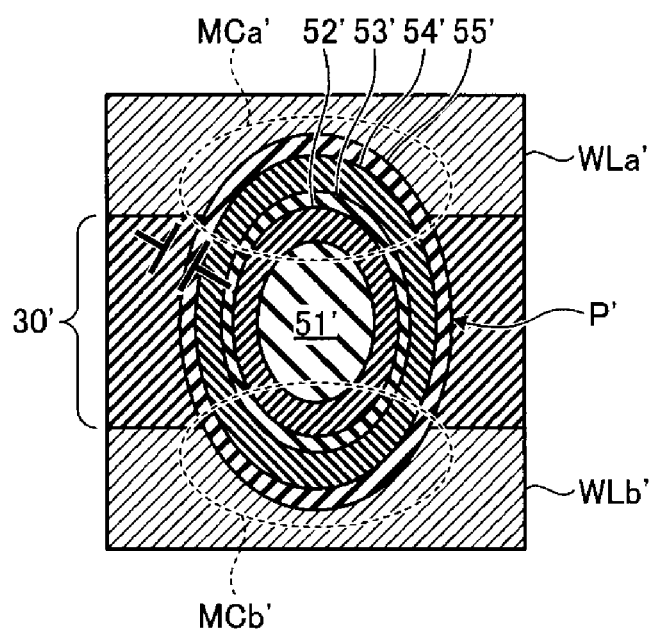
FIG. 15 is a plan view of a semiconductor memory device near a pillar according to a comparative example.

A semiconductor memory device according to a comparative example will next be described with reference to FIG. 15. In FIG. 15, configurations corresponding to those of the semiconductor memory device 1 according to the embodiment are denoted by the same reference signs to those for denoting the configurations of the semiconductor memory device 1 according to the embodiment to which an apostrophe added. Word lines WLa' and WLb' are divided by insulating films 30'. The insulating films 30' are, for example, $SiO_2$ films and do not include the electron capture layers.

In the semiconductor memory device according to the comparative example configured as described above, writing of data to the memory cells MCa' and MCb' is susceptible to the formation of parasitic cells. A case of writing data of "1" to the memory cell MCa' will be described below.

Figure 16:
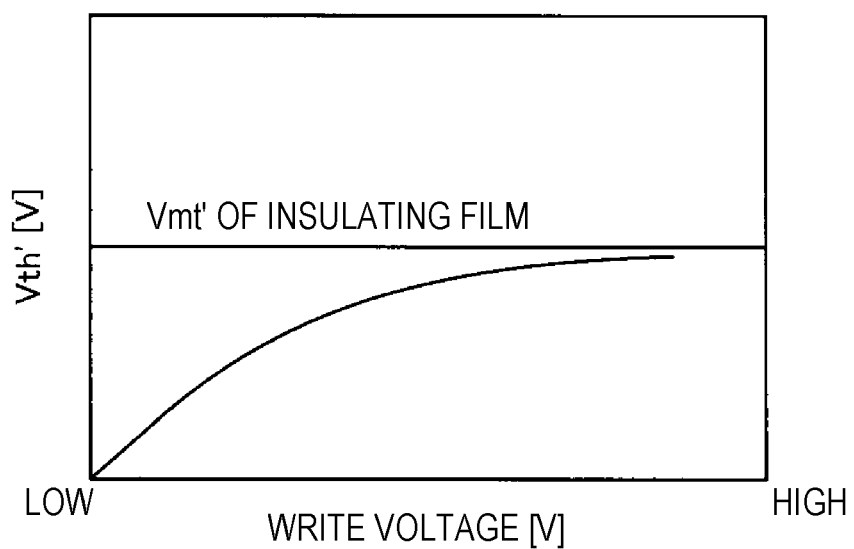
FIG. 16 is a graph representing a transition of a threshold voltage during writing of data to a memory cell in the semiconductor memory device according to the comparative example.

A portion, on a side facing the insulating film 30', of a tunnel insulating layer 53' surrounding the pillar P' is far from the word line WLa' and it is difficult to apply a voltage to the portion of the tunnel insulating layer 53'. Owing to this, it is difficult to cause electrons to tunnel through the tunnel insulating layer 53' and to be injected into the charge storage layer 54'. A cell that exhibits such an unintended behavior near the insulating films 30' is referred to herein as a "parasitic cell". In such a parasitic cell, a threshold voltage Vth' is eventually raised only to peak out at a voltage approximately equal to a voltage Vmt' inherent in the insulating film 30' itself. The cell (proper memory cell MC') on a side facing the word line WLa' is in a parallel relationship with the parasitic cell; thus, the threshold voltage Vth' of the entire memory cell MC' becomes approximately as low as the threshold voltage Vth' of the parasitic cell. A transition of the threshold voltage Vth' of the memory cell MCa' influenced by the parasitic cell is illustrated in a graph of FIG. 16.

Figure 17:
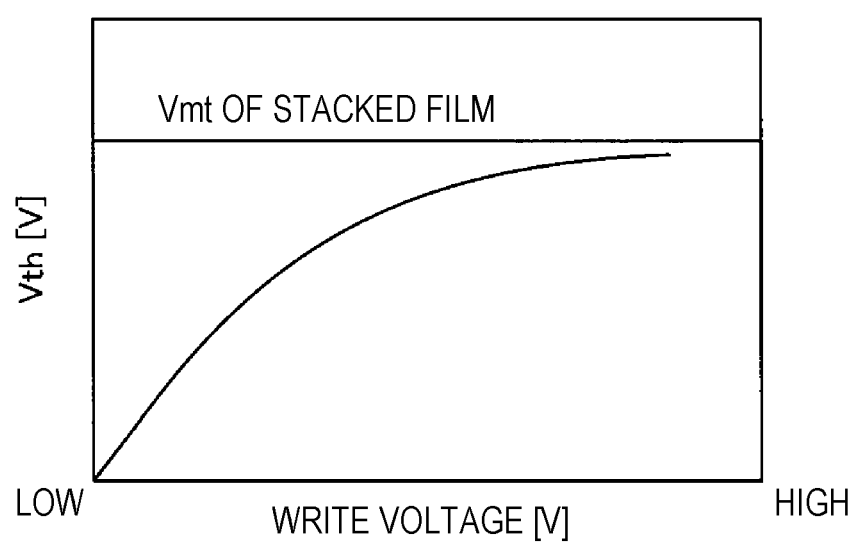
FIG. 17 is a graph representing a transition of a threshold voltage during writing of data to a memory cell in the semiconductor memory device according to the embodiment.

In the semiconductor memory device 1 according to the embodiment, a voltage is applied to the stacked film 30 in advance to raise a voltage Vmt of the stacked film 30 itself. Furthermore, for effectively raising the voltage Vmt, the electron capture layers 32a and 32b are provided in the stacked film 30 to capture electrons into the electron capture layers 32a and 32b. It is thereby possible to reduce the influence of the parasitic cell described above and quickly raise the threshold voltage Vth of the memory cells MCa and MCb. A transition of the threshold voltage Vth of the memory cell MCa with the influence of the parasitic cell on the memory cell MCa reduced is illustrated in a graph of FIG. 17. Since the voltage Vmt of the stacked film 30 is kept high, the threshold voltage Vth of the memory cell MCa is prevented from maxing out at the low voltage.

Modification

Figure 18:
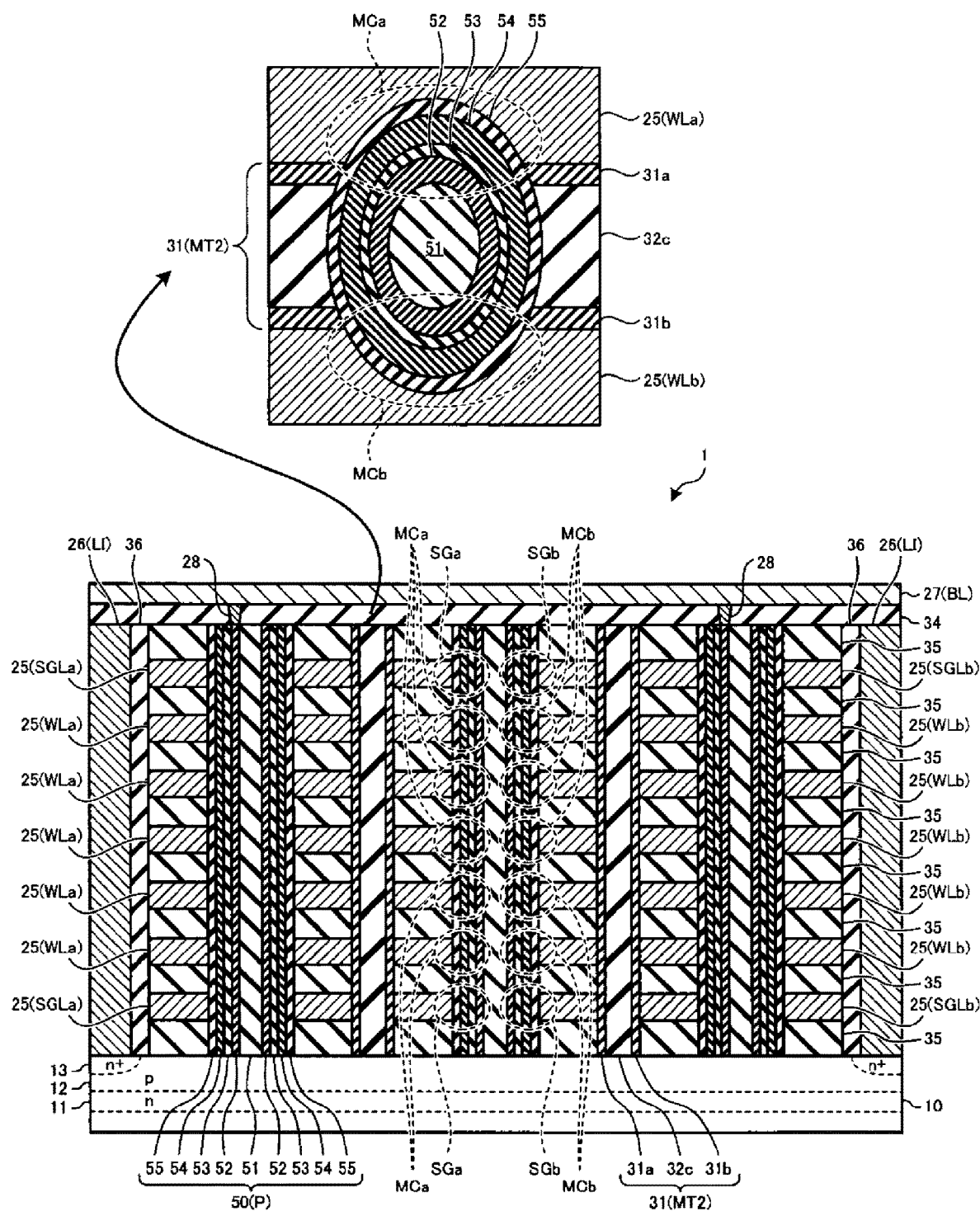
FIG. 18 is a plan view of a semiconductor memory device and an enlarged view of the semiconductor memory device near a pillar according to a modification of the embodiment.

While it is described in the above embodiment that the stacked film 30 includes the insulating layers 31a and 31b, the electron capture layers 32a and 32b, and the insulating layer 33, the stacked film 30 does not necessarily include the insulating layer 33. FIG. 18 illustrates such a configuration. In FIG. 18, similar configurations to those in the semiconductor memory device 1 according to the embodiment are denoted by similar reference signs and description thereof will be omitted.

A stacked film 31 in a semiconductor memory device according to a modification includes, from a side of the word line WLa to a side of the word line WLb, an insulating layer 31a, an electron capture layer 32c, and an insulating layer 31b. The stacked film 31 functions as a dividing film MT2 dividing the word lines WLa and WLb. Furthermore, the electron capture layer 32c can capture electrons.

When the word line WLa is grounded and a high voltage is applied to the word line WLb, electrons are captured into the electron capture layer 32c near the insulating layer 31a and it is possible to reduce the influence of the parasitic cell on the memory cell MCa. When the word line WLb is grounded and a high voltage is applied to the word line WLa, electrons are captured into the electron capture layer 32c near the insulating layer 31a and it is possible to reduce the influence of the parasitic cell on the memory cell MCb.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to +0.05%.

While certain embodiments have been described herein, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device comprising: a semiconductor substrate;
    a pillar disposed above the semiconductor substrate and extending in a first direction crossing a principal surface of the semiconductor substrate;
    a plurality of first memory cells arranged on a first side surface of the pillar along the first direction;
    a plurality of second memory cells arranged on a second side surface of the pillar along the first direction, each of the first memory cells and the second memory cells including a charge storage layer:
    a plurality of first control gate layers disposed along the first direction and respectively connected to the first memory cells;
    a plurality of second control gate layers disposed along the first direction and respectively connected to the second memory cells; and
    a stacked film disposed between one of the first control gate layers and one of the second control gate layers, the stacked film including a first insulating layer, a second insulating layer, and an electron capture layer disposed between the first insulating layer and the second insulating layer, the electron capture layer configured to capture electrons,
    wherein the electron capture layer is separate from the charge storage layer of each of the first memory cells and the second memory cells.

2. The semiconductor memory device according to claim 1, wherein
    the semiconductor memory device is configured to write data to the first and second memory cells while electrons are captured in the electron capture layer in the stacked film.

3. The semiconductor memory device according to claim 1, wherein
    the semiconductor memory device is configured to write data to one of the first memory cells after the first control gate layer connected to the one of the first memory cells is grounded, the corresponding second control gate layer has a high voltage applied to it, and electrons are captured in the electron capture layer in the stacked film; and
    the semiconductor memory device is configured to write data to one of the second memory cells after the second control gate layer connected to the one of the second memory cells is grounded, the corresponding first control gate layer has a high voltage applied to it, and electrons are captured in the electron capture layer in the stacked film.

4. The semiconductor memory device according to claim 1, wherein
    the first insulating layer comprises a material lower in relative dielectric constant than a material of the electron capture layer, and
    the second insulating layer comprises a material lower in relative dielectric constant than the material of the electron capture layer.

5. The semiconductor memory device according to claim 1, wherein
    the electron capture layer is a SiN layer, a $HfO_2$ layer, a $ZrO_2$ layer, or a $SiO_2$ layer, and
    the first and second insulating layers are $SiO_2$ layers or Low-K layers.

6. The semiconductor memory device according to 1, wherein
    the electron capture layer includes two SiN layers and a $SiO_2$ layer disposed between the SiN layers, and
    the first insulating layer and the second insulating layer are $SiO_2$ layers, SiON layers, or SiOC layers.

7. A method of writing to memory, comprising:
    providing the semiconductor memory device according to claim 1;
    writing data to one of the first memory cells after the first control gate layer connected to the one of the first memory cells is grounded, the corresponding second control gate layer has a high voltage applied to it, and electrons are captured in the electron capture layer in the stacked film; and writing data to one of the second memory cells after the second control gate layer connected to the one of the second memory cells is grounded, the corresponding first control gate layer has a high voltage applied to it, and electrons are captured in the electron capture layer in the stacked film.

\* \* \* \* \*